United States Patent [19]
Holdermann et al.

[11] Patent Number: 5,591,565
[45] Date of Patent: Jan. 7, 1997

[54] SOLAR CELL WITH COMBINED METALLIZATION AND PROCESS FOR PRODUCING THE SAME

[75] Inventors: Konstantin Holdermann, Offingen; Adolf Münzer, Lohhof; Hans-Josef Schmidt, Münich, all of Germany

[73] Assignee: Siemens Solar GmbH, Munich, Germany

[21] Appl. No.: 307,605

[22] PCT Filed: Mar. 10, 1993

[86] PCT No.: PCT/DE93/00223

§ 371 Date: Sep. 20, 1994

§ 102(e) Date: Sep. 20, 1994

[87] PCT Pub. No.: WO93/19492

PCT Pub. Date: Sep. 30, 1993

[30] Foreign Application Priority Data

Mar. 20, 1992 [DE] Germany ............... 42 09 170.5

[51] Int. Cl.[6] .................. H01L 31/0224; H01L 31/00

[52] U.S. Cl. ................ 430/314; 216/18; 427/74; 437/2; 437/4; 136/256

[58] Field of Search ............... 430/314; 216/18; 427/74; 437/2, 4; 136/256

[56] References Cited

U.S. PATENT DOCUMENTS

| | | | |
|---|---|---|---|
| 4,256,513 | 3/1981 | Yoshida et al. | 437/2 X |
| 4,297,393 | 10/1981 | Denning | 427/88 |
| 4,400,214 | 8/1983 | Ogawa et al. | 106/1.13 |
| 5,011,565 | 4/1991 | Dube et al. | 156/643 |

*Primary Examiner*—Cynthia Hamilton
*Attorney, Agent, or Firm*—Hill, Steadman & Simpson

[57] ABSTRACT

A process for producing front and rear contacts on a solar cell provides for producing a channel structure on the passivation layer of a silicon wafer, producing a rear contact by printing and firing a silver paste that has an aluminum dopant, treating the wafer with a palladium solution containing fluoride to produce a nucleation layer on the surface of the channel structure, and reinforcing the nucleation layer by depositing a further metal.

12 Claims, 1 Drawing Sheet

SOLAR CELL WITH COMBINED METALLIZATION AND PROCESS FOR PRODUCING THE SAME

BACKGROUND OF THE INVENTION

1. Field of the Invention

The present invention relates generally to a solar cell, and more particularly to a method for producing front and rear contacts on a solar cell.

2. Description of the Related Art

Highly efficient solar cells made of polycrystalline or monocrystalline semiconductor material, for example of silicon, have to be optimized in all details to give high efficiency. For this reason, use is made, for example, of wafers which have only weak doping and therefore have a low defect density. The pn transition is produced on the front or light-incident side, for example, by diffusing in phosphorus, with the highly doped zone thus created having only a small depth.

To improve the conducting away of current at the rear side of the solar cell, the doping is increased directly under the rear side contact. For this purpose, use is usually made of aluminum which is, for example, applied and diffused in on the rear side by vapor deposition or in another way.

Various methods and processes are known for metallizing the solar cells and for producing the contacts to conduct away the current. Structured metallization can be produced in a simple way by printing. A screen printing process using an electrically conductive paste containing metal particles can be used to produce any electrode structures. Metallization can be produced by vapor deposition of thin metal layers and be reinforced in a further step, for example by immersion soldering, electrolytic deposition or electroless chemical deposition. On appropriately prepared surfaces, it is also possible to produce the metallization by chemical deposition directly on the semiconductor surface.

Front side contacts applied by screen printing can only be produced in structural widths down to a minimum of about 80 µm. To further increase the performance of the solar cells, finer structures are required for the front side contact, so as to reduce the shadowing of active solar cell surfaces caused by these.

WO-A-91 08 584 discloses a process for producing a point-contact solar cell in which a pattern of microscopic openings is produced for the front side contact by means of a laser. Point-shaped nickel contacts are produced in these openings, which contacts are reinforced and electrically connected to one another by chemical deposition of copper. For the rear side contact, use is made of an aluminium layer which is applied by vapor deposition or is printed on.

European Patent Application 15 63 66 discloses a process for producing a solar cell having front side contacts arranged in channels in which the channels are produced by laser engraving. The front side contacts can be produced by filling the channels with electrically conductive paste and subsequent firing of the same and be reinforced by immersion soldering. Alternatively, the front side contact is produced by electroless deposition of nickel, is sintered and reinforced by copper plating.

Solar Cells, Volume 15, No. 1, September 1985, pages 1 to 25, discloses a thick film technique for producing solar cell contacts. For the rear contact, use is made of a screen printing paste comprising silver and aluminum.

M. A. Green: "High efficiency silicon solar cells" discloses a solar cell having a textured front side and front side contact arranged in channels. Front and rear side contact can be produced by simultaneous electroless deposition of nickel and subsequently of copper.

SUMMARY OF THE INVENTION

It is an object of the present invention to provide an improved process for producing front and rear side contacts of silicon solar cells which allows simple production of the rear side contact and by means of which a finely structured and firmly adhering front side contact can be produced without damaging the rear side contact.

This and other objects and advantages are achieved according to the invention by a process for producing front and rear side contacts on a solar cell comprising a monocrystalline or polycrystalline silicon wafer having a flat p/n transition and a passivation layer on the front side, which comprises the steps of:

producing a channel structure in the passivation layer;

producing a rear side contact by printing on and firing a silver-containing paste which additionally comprises, besides oxidic additives, aluminum as a dopant;

treating the wafer with an ionogenic palladium solution containing fluoride ions to produce a nucleation layer on the surface of the wafer exposed in the channel pattern;

reinforcing the nucleation layer by deposition of at least one further metal from the solution. Further embodiments of the invention further define the process, wherein the channel structure is defined by photolithography and is produced by wet chemical etching. Alternately, the channel structure is produced by laser engraving. In another embodiment, the channel structure is produced by mechanical removal of passivation layer and of silicon and by subsequent etching.

A preferred development of the process includes the palladium nucleation layer being reinforced by chemical deposition of a nickel layer having a thickness of from 1 to 5 µm and subsequently by electroless deposition of a copper layer having a thickness of from 5 to 20 µm. Alternately, the process provides that the palladium nucleation layer is reinforced by deposition of a silver layer having a thickness of from 5 to 20 µm.

Preferably, a silicon wafer having a textured surface is used.

The rear side contact is applied by means of screen printing in the form of a net structure on the rear side of the wafer. The channel structure produced to a depth of about 15 µm.

The process is further distinguished wherein the channel structure is produced exclusively by removing the passivation layer in the region of the grid electrode for the front side contact.

The solar cell of the invention is a so-called hybrid contact solar cell, in which the different metallizations for front and rear side contacts are combined in an advantageous way. Chemical deposition of metals allows finer structures to be produced than by screen printing, not the least because of the higher specific conductivity of the pure metal compared with a screen printing paste. The rear side contact is printed in a known manner. The structure widths of the rear side contact are of no importance, since the problem of shadowing cannot occur here. The additional dopant contained in the printing paste diffuses into the active semiconductor layer of the solar cell during sintering of the printed rear side contact, there reinforces the doping and thus produces a good electrical contact between semiconductor and rear side contacts. An additional application and/or diffusing in of dopant on the rear side by vapor deposition, spraying or similar processes is omitted.

In a further embodiment of the invention, the surface of the solar cell is textured, for example by a crystal-oriented etching process. Such a surface having pyramidal reliefs or recesses gives reduced reflexion of incident light, or higher absorption.

The front side contact is arranged in openings in a nitride or oxide layer which serves as a passivation layer on the front side of the solar cell. These openings are preferably channels which can be introduced down into the active semiconductor layer. This improves the adhesion of the front side contact compared with a raised electrode structure, even in the case of very fine structures. In the openings on the exposed semiconductor material, selective chemical deposition of metals then takes place. This is carried out in two stages, with a nucleation layer comprising, for example, palladium being first produced, and this layer subsequently being reinforced by electrolytic or electroless deposition. The nucleation layer can here be a closed, thin palladium layer or only a layer of individual palladium nuclei. Besides palladium, the front side contact comprises, for reinforcement, at least one further metal selected from among copper, nickel or silver. When using copper as the material for the front side contact, a thin diffusion barrier layer comprising another metal is required between the copper and the semiconductor material. However, because of its high electrical conductivity, silver is preferred for reinforcing the front side contact.

The rear side contact can be applied as a continuous layer or, to save material, can have, for example, a net-like structure. The paste used for printing the rear side contact preferably comprises, besides oxidic additives, silver particles and aluminum as a further dopant.

BRIEF DESCRIPTION OF THE DRAWINGS

The process for producing the solar cell of the invention is illustrated below with the aid of two examples and the associated FIGS. 1a to 4a and 1b to 4b. The figures show various process stages in schematic cross section.

DETAILED DESCRIPTION OF THE PREFERRED EMBODIMENTS

EXAMPLES

The production of a solar cell made of crystalline silicon is described as a representative of various suitable types of solar cell.

Figure 1A:
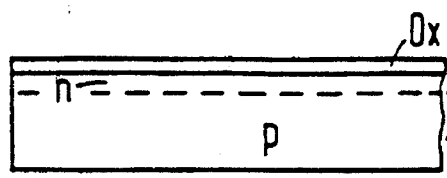
Figure 1B:
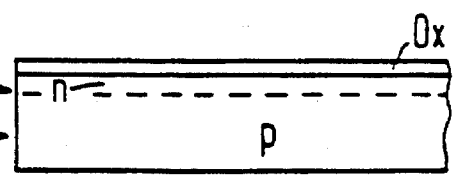

FIG. 1: the starting material is a p-doped Czochralski wafer having an angular <100> orientation. Basic crystal-oriented etching is first used to texture the surface of the substrate S. Preferential etching along certain crystal orientations thus gives a roughened surface having pyramidal reliefs (not shown in the Figure). In this surface, which serves as a front side of the future solar cell, a flat pn transition Tr is produced, for example by diffusing in phosphorus P, with a flat n-doped zone n being formed. To passivate the surface, a passivation layer is produced on the front side, for example an oxide layer Ox, which simultaneously serves as an antireflection layer in the future solar cell. The same function can also be fulfilled by a silicon nitride layer or a combined layer comprising both materials.

Figure 2A:
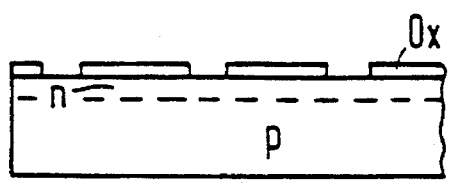

The next step is the definition and production of the front side contact on or in the oxide layer Ox. For this purpose, openings, for example channels, corresponding to the desired structure of the metallization are produced in the oxide layer Ox (see FIG. 2a) and, if desired, channels are etched into the silicon (see FIG. 2b).

A structured opening in the oxide Ox can, for example, be achieved by photolithographic and etching processes. Further processing can then be carried out using either the planar technique (FIG. 1a to 4a) or the channel technique (FIG. 1b to 4b).

Figure 2B:
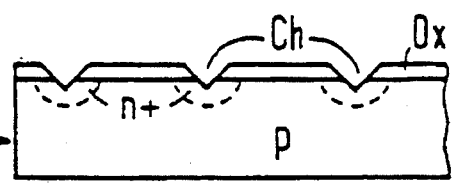

FIG. 2b: direct production of the channels Ch is achieved by laser engraving, with the oxide layer Ox and, if desired, silicon being removed along the desired structure using a laser of suitable wavelength.

It is likewise possible to produce channels Ch by mechanical removal of material, for example by means of a diamond-plated tool. Further processing is then carried out as for laser structuring.

As an alternative, a photolithography step can be carried out, in which first a photoresist acting as a positive is applied, exposed to light in accordance with the desired structure and finally developed. The remaining photoresist structure then serves as an etching mask for the subsequent wet chemical oxide opening, for example in a solution containing hydrofluoric acid.

The production of channels in the silicon is carried out in a basic solution using the remaining oxide as the etching mask. For particularly thin wafers (substrates), the planar technique (FIG. 1a to 4a) is preferred owing to the danger of fracture.

In the example, the width of the channels is from about 20 to 50 µm, while the distance from one channel Ch to the adjacent one is about 1 mm.

In the channel technique, the n-doping is reinforced by producing $n^+$-doped regions in the region of the channels Ch by means of renewed phosphorus diffusion. The oxide layer Ox here serves as a mask. The arrangement thus produced is shown in FIG. 2b.

Figure 3A:
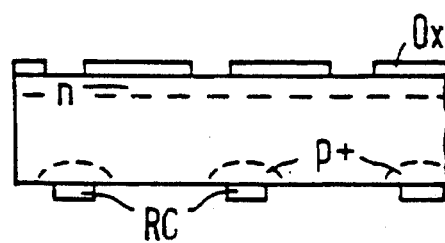
Figure 3B:
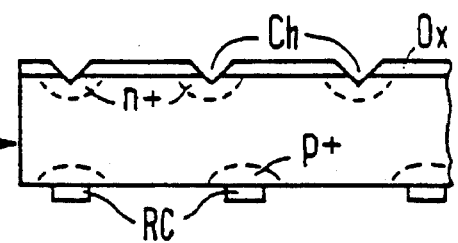

FIG. 3a/3b: in the next process step, the rear side contact is produced by printing on a conductive paste. Screen printing processes are particularly suitable, but other application processes can also be used in principle. Suitable methods are, for example, template printing, dabber printing, paste inscription, rolling on and similar processes. The paste itself possesses a viscosity suitable for the printing process and contains, besides oxidic components, a metal having good conductivity, for example silver. The paste preferably also comprises a further dopant, for example aluminum, to create a better rear side contact. The rear side contact RC can be applied over the whole area. However, sufficiently good conducting away of current is achieved by a cost-saving net-like structure where the mesh aperture or the spacing of the printed conductor strips is greater than the spacing of the channel structure corresponding to the future front side metallization. Sintering of the printed structure drives the additional dopant into the substrate S, there produces $p^+$-doped zones and thus achieves a good electrical contact between the substrate S and the rear side contact RC.

Subsequently, the front side contact is produced by metallization in the channels Ch. For this purpose, a palladium nucleation layer NL is first selectively deposited in the nitride-free or oxide-free regions of the surface (channels) from an ionogenic palladium solution. Chemical deposition of a further layer of a metal having good electrical conductivity reinforces the nucleation layer NL. A suitable reinforcing layer is, for example, a nickel/copper double layer, with a nickel layer Ni having a thickness of from about 1 to 5 μm, preferably about 2 μm, being first deposited by an electroless method over the nucleation layer NL. Likewise by an electroless method, a copper layer RL having a thickness of from 5 to 20 μm is produced on top of this, which copper layer can, if desired, be protected against oxidation by a further thin layer, for example by a thin coating of nickel, silver or tin.

However, the further reinforcing layer (RL) is preferably produced by electrolytic deposition of a silver layer having a thickness of from about 5 to 20 μm. A silver salt solution containing a cyanide can be used for this purpose. Cyanide-free baths, for example based on silver chloride and sodium thiosulfate, are likewise suitable.

Figure 4A:
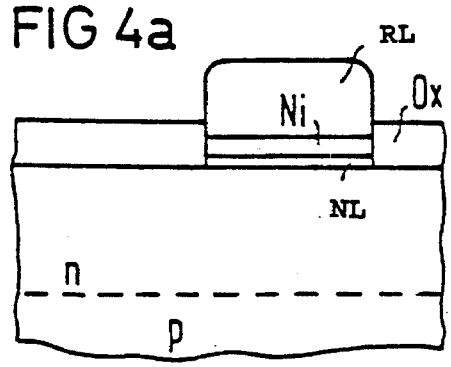
Figure 4B:
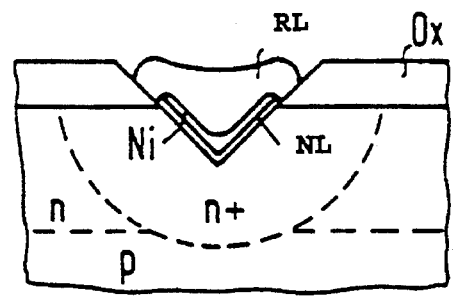

FIG. 4 shows, in section, an oxide opening (FIG. 4a) or a channel with the front side metallization deposited therein. The channel shown in FIG. 4b here has a v-shaped cross section, but can also be produced with a flat bottom, i.e. with a trapezoidal or rectangular cross section. The depth of the channel is here about 15 μm, but can also be shallower or deeper. For the process of the invention, it is merely necessary to expose the surface of the crystalline substrate S by removing the covering oxide Ox or nitride, as in FIGS. 1a to 4a. When the specified layer thicknesses for the front side contacts and the channel depth are adhered to, the front side contacts are sunken into the surface of the solar cell. It is also possible to make the front side contacts thicker, so that they are raised above the remaining surface of the oxide layer Ox (see for example FIG. 4a).

The process of the invention makes it possible, for the first time, to combine a finely structured front side contact having structural widths down to 30 μm and a simple process for producing the rear side contacts. In addition, the production of the rear side contact can be carried out in a single step by means of the dopant-containing paste, whereas known processes require an extra step for producing the additional doping in the region of the rear side contact.

Furthermore, it is surprising and novel that the printed rear side contact survives the metallization steps during production of the front side contact without damage and forms a low ohm electrical contact with the substrate S. Neither the fluoride ion-containing medium of the palladium solution nor the high temperature and/or the basic or acid metallization baths impair the properties of the rear side contact and thus the whole solar cell. The rear side contact does not have to be protected or sealed in this process.

The deposition or production of the front side contact in channels makes possible a larger contact area between front side contact and substrate and ensures better adhesion of the contact on the surface. The channels Ch in the passivation layer Ox additionally permit a targetted $n^+$ doping in the region of the contacts, so that the diffusion lengths for the charge carriers in the remaining crystalline substrate material retain a sufficient length.

The solar cells produced in the example achieve efficiencies of over 16.5 percent.

In principle, the process can also be used for substrates made of polycrystalline silicon or other semiconductor materials, in which cases adaptation of various process steps may be required. However, something which is always essential is the combination of the printing process for the production of the rear side contact with the chemical deposition of the front side contact, which leads to the advantages described.

Although other modifications and changes may be suggested by those skilled in the art, it is the intention of the inventors to embody within the patent warranted hereon all changes and modifications as reasonably and properly come within the scope of their contribution to the art.

We claim:

1. A process for producing front and rear side contacts on a solar cell including a silicon wafer having a flat p/n transition and a passivation layer on a front side which comprises the steps of:

producing a channel structure in the passivation layer;

producing a rear side contact by printing on and firing a silver-containing paste which additionally comprises oxidic additives and aluminum as a dopant;

treating the silicon wafer with an ionogenic palladium solution containing fluoride ions to produce a nucleation layer on a surface of the silicon wafer exposed in the channel structure;

reinforcing the nucleation layer by deposition of at least one further metal from the ionogenic palladium solution.

2. A process as claimed in claim 1, wherein said step of producing a channel structure includes:

defining the channel structure by photolithography and forming the channel structure by wet chemical etching.

3. A process as claimed in claim 1, wherein said step of producing a channel structure includes:

forming the channel structure by laser engraving.

4. A process as claimed in claim 1, wherein said step of producing a channel structure includes:

mechanically removing material.

5. A process as claimed in claim 1, further comprising the step of:

reinforcing the palladium nucleation layer by chemical deposition of a nickel layer having a thickness of from 1 to 5 μm and subsequently by electroless deposition of a copper layer having a thickness of from 5 to 20 μm.

6. The process as claimed in claim 1, further comprising the step of:

reinforcing the palladium nucleation layer by deposition of a silver layer having a thickness of from 5 to 20 μm.

7. A process as claimed in claim 1, wherein a silicon wafer having a textured surface is used as said silicon wafer.

8. A process as claimed in claim 1, wherein said step of producing a rear side contact includes applying the rear side contact by screen printing of a net structure on a rear side of the silicon wafer.

9. A process as claimed in claim 1, wherein the step of producing a channel structure produces a channel structure with a depth to about 15 μm.

10. A process as claimed in claim 1, wherein the step of producing a channel structure produces the channel structure exclusively by removing the passivation layer in a region for a front side contact.

11. A process as claimed in claim 1, wherein said wafer is a monocrystalline silicon wafer.

12. A process as claimed in claim 1, wherein said wafer is a polycrystalline silicon wafer.

\* \* \* \* \*